US010882293B2

(12) United States Patent
Ogawa et al.

(10) Patent No.: US 10,882,293 B2
(45) Date of Patent: Jan. 5, 2021

(54) METHOD OF MANUFACTURING IMAGE DISPLAY APPARATUS

(71) Applicant: DEXERIALS CORPORATION, Tokyo (JP)

(72) Inventors: Kouichi Ogawa, Utsunomiya (JP); Yoshihisa Shinya, Utsunomiya (JP); Naoki Hayashi, Kanuma (JP); Tomoyuki Toyoda, Kanuma (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/630,347

(22) Filed: Jun. 22, 2017

(65) Prior Publication Data

US 2017/0282530 A1    Oct. 5, 2017

Related U.S. Application Data

(62) Division of application No. 14/353,900, filed as application No. PCT/JP2013/062552 on Apr. 30, 2013, now Pat. No. 9,718,264.

(30) Foreign Application Priority Data

May 9, 2012   (JP) .................................. 2012-107707

(51) Int. Cl.
*B32B 37/14*   (2006.01)
*H01L 51/52*   (2006.01)
(Continued)

(52) U.S. Cl.
CPC .............. *B32B 37/14* (2013.01); *G02F 1/133* (2013.01); *H01L 33/005* (2013.01);
(Continued)

(58) Field of Classification Search
CPC ....... B32B 37/14; G02F 1/133; H01L 33/005; H01L 51/5253
See application file for complete search history.

(56) References Cited

U.S. PATENT DOCUMENTS 5,747,551 A * 5/1998 Lewandowski ............ C09J 4/00
522/95
6,649,259 B1 * 11/2003 Hu ......................... C09J 7/0221
264/460
(Continued)

FOREIGN PATENT DOCUMENTS

CN   101331529 A   12/2008
CN   101652803 A   2/2010
(Continued)

OTHER PUBLICATIONS

Oct. 22, 2013 International Preliminary Report on Patentability issued in International Application No. PCT/JP2013/062552.
(Continued)

*Primary Examiner* — Daniel McNally
(74) *Attorney, Agent, or Firm* — Oliff PLC

(57) ABSTRACT

In the method of manufacturing an image display apparatus according to the present invention, a liquid photocurable resin composition that does not contain a thermal polymerization initiator is coated on the surface of a light-transmissive cover member including a light shielding layer or the surface of an image display member in a thickness thicker than that of the light shielding layer, and thereafter UV rays are irradiated in that state for curing to form a light-transmissive cured resin layer. Then, the image display member and the light-transmissive cover member are laminated to each other via the light-transmissive cured resin layer to obtain an image display apparatus.

10 Claims, 4 Drawing Sheets

(51) Int. Cl.
*G02F 1/133* (2006.01)
*H01L 33/00* (2010.01)
*G02B 5/00* (2006.01)

(52) U.S. Cl.
CPC .......... *H01L 51/5253* (2013.01); *G02B 5/003* (2013.01); *H01L 51/5284* (2013.01)

(56) References Cited

U.S. PATENT DOCUMENTS

| | | | |
|---|---|---|---|
| 6,995,193 B1 | 2/2006 | Fukui | |
| 2005/0181148 A1* | 8/2005 | Kim | C08F 220/12 428/1.55 |
| 2005/0182150 A1 | 8/2005 | Bamborough et al. | |
| 2007/0218374 A1* | 9/2007 | Kitano | G11B 7/252 430/14 |
| 2009/0162645 A1 | 6/2009 | Matsuhira | |
| 2010/0003425 A1* | 1/2010 | Kamata | G02F 1/133308 428/1.5 |
| 2010/0043965 A1 | 2/2010 | Kamiya et al. | |
| 2010/0097746 A1 | 4/2010 | Toyoda et al. | |
| 2010/0164881 A1 | 7/2010 | Kuo et al. | |
| 2010/0277684 A1 | 11/2010 | Fukushima et al. | |
| 2011/0134378 A1 | 6/2011 | Tsuboi et al. | |
| 2014/0069581 A1* | 3/2014 | Ogawa | G02F 1/133512 156/275.5 |

FOREIGN PATENT DOCUMENTS

| | | | |
|---|---|---|---|
| CN | 101681575 A | 3/2010 | |
| CN | 101816026 A | 8/2010 | |
| EP | 2144218 A1 | 1/2010 | |
| EP | 2144218 A1 * | 1/2010 | ....... G02F 1/133308 |
| JP | 2003337341 A | 11/2003 | |
| JP | 2009-186954 A | 8/2009 | |
| JP | 2009186956 A | 8/2009 | |
| JP | 2011-138099 A | 7/2011 | |
| JP | 2012-47929 A | 3/2012 | |
| JP | 2012-071281 A | 4/2012 | |
| JP | 5370706 B1 | 12/2013 | |
| JP | 2013254195 A | 12/2013 | |
| KR | 100945381 B1 | 3/2010 | |
| WO | 2007/0066590 A1 | 6/2007 | |
| WO | WO-2007069856 A1 * | 6/2007 | .............. C08L 33/08 |
| WO | 2008/126860 A1 | 10/2008 | |
| WO | 2009/054168 A1 | 4/2009 | |
| WO | 2010/027041 A1 | 3/2010 | |
| WO | 2011/010599 A1 | 1/2011 | |
| WO | WO-2011112447 A2 * | 9/2011 | ......... B32B 37/1207 |
| WO | 2011/148990 A1 | 12/2011 | |

OTHER PUBLICATIONS

Nov. 13, 2014 International Preliminary Report on Patentability issued in International Application No. PCT/JP2013/062552.
Mar. 27, 2015 Office Action issued in Taiwanese Patent Application No. 102116497.
Jul. 6, 2015 Office Action issued in Chinese Patent Application No. 201380002824.6.
Jan. 20, 2016 Office Action issued in U.S. Appl. No. 14/353,900.
Feb. 4, 2016 Extended European Search Report issued in European Application No. 13788012.6.
Feb. 15, 2016 Office Action issued in Korean Application No. 2014-7005040.
Nov. 3, 2016 Office Action issued in U.S. Appl. No. 14/353,900.
Dec. 28, 2016 Office Action issued in Korean Application No. 10-2014-7005040.
Mar. 10, 2017 Notification of Reasons for Refusal issued in Japanese Application No. 2014-024291.
May 1, 2017 Office Action issued in Korean Application No. 10-2014-7005040.
Jul. 9, 2013 International Search Report issued in International Application No. PCT/JP2013/062552.
Sep. 12, 2017 Notification of Reasons for Refusal issued in Japanese Application No. 2014-024291.
May 24, 2018 Office Action issued in Korean Application No. 10-2017-7008687.
Jul. 18, 2018 Office Action issued in European Application No. 13 788 012.6.
Feb. 28, 2020 Office Action issued in Chinese Patent Application No. 201610979393.4.
Jul. 8, 2020 Office Action issued in European Patent Application No. 13 788 012.6.

* cited by examiner

METHOD OF MANUFACTURING IMAGE DISPLAY APPARATUS

TECHNICAL FIELD

The present invention relates to a method of manufacturing an image display apparatus by bonding and laminating an image display member such as a liquid crystal display panel and a light-transmissive cover member such as a transparent protective sheet disposed on the surface side of the image display member, via a light-transmissive cured resin layer.

BACKGROUND ART

An image display apparatus such as a liquid crystal display panel used in information terminals such as a smartphone is manufactured by disposing a photocurable resin composition between an image display member such as a liquid crystal display panel or an organic EL display panel, and a light-transmissive cover member; and thereafter irradiating UV rays to the resin composition so as to cure into a light-transmissive cured resin layer, thereby bonding and laminating the image display member and the light-transmissive cover member (Patent Literature 1).

In the image display apparatus, a light shielding layer for improving the brightness and contrast of a display image is disposed around an outer edge on the image display member-side surface of the light-transmissive cover member. For this reason, curing of the photocurable resin composition disposed between such a light shielding layer and the image display member does not sufficiently proceed, and therefore, sufficient adhesion cannot be obtained. Accordingly, it is concerned that a peeling between the transmissive cover member and the image display member is caused, and that moisture invades a space between the transmissive cover member and the image display member, resulting in a reduced image quality.

Under such circumstances, there is proposed a method of: mixing a thermal polymerization initiator in a photocurable resin composition to obtain a heat- and photocurable resin composition; coating the surface of the light-transmissive cover member having the light shielding layer formed thereon with the heat- and photocurable resin composition; laminating the coated surface to the image display member; irradiating UV rays for photocuring; and thereafter heating the whole for heat-curing of the heat- and photocurable resin composition located between the light shielding layer and the image display member (Patent Literature 2).

CITATION LIST

Patent Literature

Patent Literature 1: WO2010/027041
Patent Literature 2: WO2008/126860

SUMMARY OF INVENTION

Technical Problem

However, according to the technology of Patent Literature 2, although the problems concerned in Patent Literature 1 can be expected to be solved, it is required to use a thermal polymerization initiator in addition to a photopolymerization initiator at the same time, and to perform a thermal polymerization process as well as a photopolymerization process. Therefore, there have been problems that an initial investment for the thermal polymerization process becomes larger, and that the storage stability of the heat- and photocurable resin composition is reduced. Furthermore, when the light-transmissive cover member including the heat- and photocurable resin composition coated thereon is laminated to the image display member, the resin composition is not subjected to a curing process yet. As a result, the resin composition is eliminated from between the light shielding layer and the image display member. Accordingly, a step formed between the light shielding layer and the surface of the light-transmissive cover member is not canceled. It is also concerned that air bubbles are generated, and an interlayer peeling between the light-transmissive cover member and the resin is caused.

An object of the present invention is to solve the above-described problems associated with conventional technologies, and to manufacture an image display apparatus by laminating an image display member and a light-transmissive cover member disposed on the surface side of the image display member via a cured resin layer of a photocurable resin composition wherein the photocurable resin composition between the light shielding layer the image display member can be sufficiently photocured and a step formed between the light shielding layer and the light-transmissive cover member can be canceled without the use of a thermal polymerization process and without being eliminated from between the light shielding layer and the image display member, and to manufacture the image display apparatus solely by a photopolymerization process.

Solution to Problem

The inventors have found that the light-transmissive cured resin layer between the light shielding layer and the image display member can be sufficiently photocured without being excessively eliminated from between the light shielding layer and the image display member, and the step formed between the light shielding layer and the light shielding layer formation-side surface of the light-transmissive cover member can be canceled, by coating the surface of the light-transmissive cover member including the light shielding layer or the surface of the image display member with a liquid photocurable resin composition that does not contain a thermal polymerization initiator in a thickness thicker than that of the light shielding layer, and thereafter irradiating UV rays in that state for curing so that the image display member and the light-transmissive cover member are laminated to each other via such a light-transmissive cured resin layer. Thus, the present invention has been completed.

That is, the present invention is a method of manufacturing an image display apparatus wherein an image display member and a light-transmissive cover member having a light shielding layer formed around an outer edge of the cover member are laminated to each other via a light-transmissive cured resin layer formed from a liquid photocurable resin composition such that the light shielding layer-formed surface of the light-transmissive cover member is arranged on the image display member side. The manufacturing method includes the following steps (A) to (C):

<Step (A)>
coating the light shielding layer formation-side surface of the light-transmissive cover member or the surface of the image display member with the liquid photocurable resin composition in a thickness thicker than that of the light shielding layer so that a step formed by the light shielding layer and the light shielding layer formation-side surface of the light-transmissive cover member is canceled;
<Step (B)>
irradiating UV rays to the coated photocurable resin composition for curing to form the light-transmissive cured resin layer; and
<Step (C)>
bonding the light-transmissive cover member with the image display member such that the light shielding layer and the light-transmissive cured resin layer are located inside.

Advantageous Effects of Invention

In the method of manufacturing an image display apparatus according to the present invention, the liquid photocurable resin composition that does not contain a thermal polymerization initiator is coated on the surface of the light-transmissive cover member including the light shielding layer or on the surface of the image display member in a thickness thicker than that of the light shielding layer, and thereafter UV rays are irradiated in that state for curing to form the light-transmissive cured resin layer. Then, the image display member and the light-transmissive cover member are laminated to each other via the light-transmissive cured resin layer. Accordingly, the light-transmissive cured resin layer between the light shielding layer and the image display member can be sufficiently photocured without being excessively eliminated from between the light shielding layer and the image display member. Furthermore, the step formed between the light shielding layer and the light shielding layer formation-side surface of the light-transmissive cover member can be canceled.

DESCRIPTION OF EMBODIMENTS

Figure 1A:
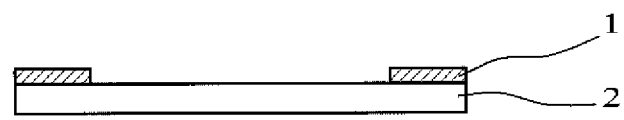
FIG. 1A is an illustrative drawing of the step (A) of the method of manufacturing an image display apparatus according to the present invention.
Figure 1B:
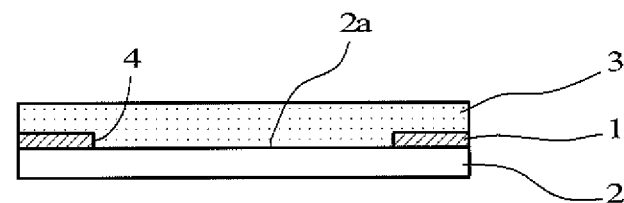
FIG. 1B is an illustrative drawing of the step (A) of the method of manufacturing an image display apparatus according to the present invention.

Hereinafter, the method of manufacturing an image display apparatus according to the present invention, which includes the steps (A) to (C), will be described it detail for each step with reference to the drawings.
<Step (A) (Coating Step)>
First, as shown in FIG. 1A, a light-transmissive cover member 2 including a light shielding layer 1 formed around an outer edge of one surface thereof is prepared. Next, as shown in FIG. 1B, a surface 2a of the light-transmissive cover member 2 is coated with a liquid photocurable resin composition 3 in a thickness thicker than that of the light shielding layer 1 so that a step 4 formed by the light shielding layer 1 and the light shielding layer formation-side surface 2a of the light-transmissive cover member 2 is canceled. Specifically, the whole of the light shielding layer formation-side surface 2a of the light-transmissive cover member 2, including the surface of the light shielding layer 1, is coated flat with the photocurable resin composition 3 so that a step does not occur. Therefore, the photocurable resin composition 3 is coated in a thickness of preferably 1.2 to 50 times, and more preferably 2 to 30 times the thickness of the light shielding layer 1.

The photocurable resin composition 3 may be coated a plurality of times to obtain a required thickness.

The light-transmissive cover member 2 has a light transmittance which allows an image formed on the image display member to be visually recognized. Examples of the light-transmissive cover member 2 may include a plate-like material and a sheet-like material of glass, an acrylic resin, polyethylene terephthalate, polyethylene naphthalate, and polycarbonate. These materials may be subjected to a single or double sided hard coating treatment, an antireflection treatment and the like. The physical properties such as a thickness and an elasticity of the light-transmissive cover member 2 can be determined depending on the intended use.

The light shielding layer 1 is provided for, for example, enhancing the contrast of an image, and is obtained by performing coating with a paint colored in black or the like by a screen printing method or the like, and then drying and curing the coat. The thickness of the light shielding layer 1 is usually 5 to 100 μm, which corresponds to the thickness of the step 4.

The property of the photocurable resin composition 3 used in this step is liquid. By using a liquid, the step 4 formed by the light shielding layer 1 and the light shielding layer formation-side surface 2a of the light-transmissive cover member 2 can be canceled. Here, a liquid indicates a substance having a viscosity of 0.01 to 100 Pa·s (at 25° C., cone-plate rheometer, cone and plate C35/2, rotational speed 10 rpm).

Examples of such a photocurable resin composition 3 may include a substance which contains, for example, radical photopolymerizable poly(meth)acrylate such as polyurethane-based (meth)acrylate and polyisoprene-based (meth)

acrylate, and a photopolymerization initiator, main ingredients. Here, the term "(meth)acrylate" means to include acrylate and methacrylate.

Preferred examples of the radical photopolymerizable poly(meth)acrylate may include a (meth)acrylate-based oligomer having polyisoprene, polybutadiene or polyurethane as a backbone.

Preferred examples of the (meth)acrylate-based oligomer having a polyisoprene backbone may include an esterified product of a maleic anhydride duct of a polyisoprene polymer and 2-hydroxyethyl methacrylate (UC102 (polystyrene-equivalent molecular weight: 17000), Kuraray Co., Ltd.; UC203 (polystyrene-equivalent molecular weight: 35000), Kuraray Co., Ltd.; UC-1 (molecular weight: approximately 25000), Kuraray Co., Ltd.).

Preferred examples of the (meth)acrylate-based oligomer having a polyurethane backbone may include an aliphatic urethane acrylate (EBECRYL 230 (molecular weight: 5000), DAICEL-ALLNEX Ltd.; UA-1, Light Chemical Industries Co., Ltd.).

As the photopolymerization initiator, publicly known radical photopolymerization initiators can be used. Examples thereof may include 1-hydroxy-cyclohexyl phenyl ketone (Irgacure 184, BASF Japan Ltd.), 2-hydroxy-1-{4-[4-(2-hydroxy-2-methyl-propionyl)benzyl]phenyl}-2-methyl-1-propan-1-one (Irgacure 127, BASF Japan Ltd.), benzophenone and acetophenone.

When the amount of the photopolymerization initiator based on 100 parts by mass of radical photopolymerizable poly(meth)acrylate is too small, curing during UV irradiation becomes insufficient. When the amount is too large, an increase of an outgas due to cleavage tends to cause a foaming failure. Therefore, the amount of the photopolymerization initiator is preferably 0.1 to 5 parts by mass, and more preferably 0.2 to 3 parts by mass.

The liquid photocurable resin composition 3 may further contain publicly known plasticizers (flexibility-imparting agents) which are compatible with the radical photopolymerizable poly(meth)acrylate. Examples of such plasticizers may include a terpene-based hydrogenated resin, polybutadiene and polyisoprene. These plasticizers may also be used as a tackifies as described later.

The photocurable resin composition 3 may also contain a reactive diluent. Preferred examples of the reactive diluent may include 2-hydroxypropyl methacrylate, benzyl acrylate and dicyclopentenyloxyethyl methacrylate.

The photocurable resin composition 3 may further contain, as necessary, general additives, for example, an adhesion-improving agent such as a silane coupling agent, and an antioxidant.

The photocurable resin composition 3 may also contain a chain transfer agent for adjusting a molecular weight. Examples of the chain transfer agent may include 2-mercapto ethanol, lauryl mercaptan, glycidyl mercaptan, mercaptoacetic acid, 2-ethylhexyl thioglycolate, 2,3-dimethyl-capto-1-propanol and α-methylstyrene dimer.

It is noted that the UV irradiation in the step (B) described later can function, in some cases, such that the initial adhesive strength (a so-called tackiness) of the photocurable resin composition 3 is decreased, and the final adhesive strength is reduced. Therefore, a so-called tackifier is desirably mixed in the photocurable resin composition 3. Examples of the tackifier used may include terpene-based resins such as a terpene resin, a terpene phenol resin and a hydrogenated terpene resin; rosin resins such as a natural rosin, a polymerized rosin, a rosin ester and a hydrogenated rosin; and petroleum resins such as polybutadiene and polyisoprene. The mixed amount of such a tackifier in 100 parts by mass of the photocurable resin composition is preferably 40 to 70 parts by mass.

Although the base material of the photocurable resin composition 3 is the above-described radical photopolymerizable poly(meth)acrylate, the radical photopolymerizable poly(meth)acrylate which has been previously polymerized can be contained as the base material in order to develop the tackiness-imparting effect of the tackifier more strongly. Examples of such a polymerized material may include a copolymer of butyl acrylate and 2-hexyl acrylate, and an acrylic acid; and a copolymer of cyclohexyl acrylate and a methacrylic acid.

<Step (B) (Curing Step)>

Figure 1C:
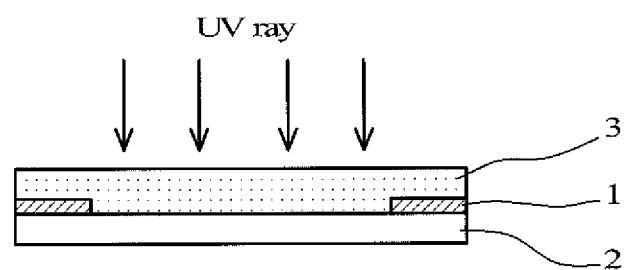
FIG. 1C is an illustrative drawing of the step (B) of the method of manufacturing an image display apparatus according to the present invention.
Figure 1D:
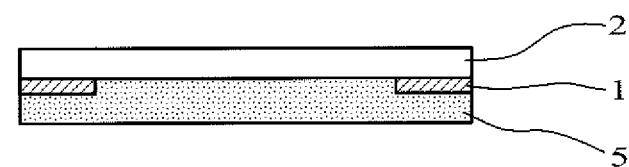
FIG. 1D is an illustrative drawing of the step (B) of the method of manufacturing an image display apparatus according to the present invention.

Next, as shown in FIG. 1C, UV rays are irradiated to the coat of the photocurable resin composition 3 formed in the step (A) for curing to form a light-transmissive cured resin layer 5 (FIG. 1D). By the curing, the light-transmissive cured resin layer 5 between the light shielding layer 1 and the image display member 6 can be sufficiently photocured without being excessively eliminated from between the light shielding layer 1 and the image display member. The level of the curing is such that the curing rate (gel fraction) of the light-transmissive cured resin layer 5 is preferably 90% or more, and further preferably 95% or more. Here, the curing rate (gel fraction) is a value defined as a ratio (consumption ratio) of the present amount of a (meth)acryloyl group after UV irradiation to the present amount of a (meth)acryloyl group before UV irradiation in the photocurable resin composition 3. The larger this value is, the further the curing proceeds.

The curing rate (gel fraction) can be calculated by substituting in a mathematical expression (1) below an absorption peak height (X) from the baseline at 1640 to 1620 $cm^{-1}$ in the FT-IR measurement chart of the resin composition layer before UV irradiation, and an absorption peak height (Y) from the baseline at 1640 to 1620 $cm^{-1}$ in the FT-IR measurement chart of the resin composition layer after UV irradiation.

$$\text{Curing rate (\%)} = \{(X-Y)/X\} \times 100 \tag{1}$$

Regarding UV irradiation, the type; output and accumulated light amount of a light source are not particularly limited as long as the curing can be performed so as to have a curing rate (gel fraction) of preferably 90% or more, and a publicly known process condition for radically photopolymerizing (meth)acrylate with UV irradiation can be adopted.

<Step (C) (Bonding Step)>

Figure 1E:
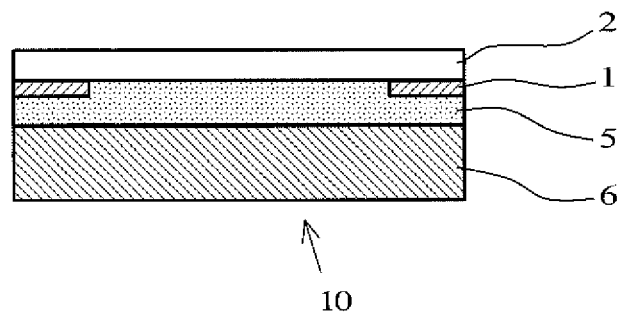
FIG. 1E is an illustrative drawing of the step (C) of the method of manufacturing an image display apparatus according to the present invention.

Next, as shown in FIG. 1E, the light-transmissive cover member 2 is bonded to an image display member 6 on the side of the light-transmissive cured resin layer 5. The bonding can be performed under pressure at 10° C. to 80° C. using a publicly known pressure bonding apparatus. Accordingly, the image display member 6 and the light-transmissive cover member 2 are laminated to each other via the light-transmissive cured resin layer 5 to obtain an image display apparatus 10.

Examples of the image display member 6 may include a liquid crystal display panel, an organic EL display panel, a plasma display panel and a touch panel. Here, the touch panel means an image display and input panel in which a display element such as a liquid crystal display panel and a position input device such as a touch pad are combined.

The light transmittance level of the light-transmissive cured resin layer 5 may be such that an image formed on the image display member 6 can be visually recognized.

Although an example in which the photocurable resin composition is coated on the light shielding layer-side surface of the light-transmissive cover member has been described in FIG. 1A to FIG. 1E, an example in which the photocurable resin composition is coated on the surface of the image display member will be described in FIG. 2A to FIG. 2D below. The same reference numerals assigned in FIG. 1A to FIG. 1E and in FIG. 2A to FIG. 2D represent the same components.

<Step (AA) (Coating Step)>

Figure 2A:
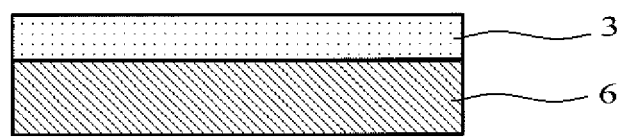
FIG. 2A is an illustrative drawing of a step (AA) of the method of manufacturing an image display apparatus according to the present invention.

First, as shown in FIG. 2A, the photocurable resin composition 3 is coated flat on the surface of the image display member 6. The coated thickness in this case is preferably 1.2 to 50 times, and further preferably 2 to 30 times the thickness of the light shielding layer so that the step formed by the light shielding layer and the light shielding layer formation-side surface of the light-transmissive cover member is canceled.

The coating of the photocurable resin composition 3 may be performed a plurality of times to obtain a necessary thickness.

<Step (BE) (Curing Step)>

Figure 2B:
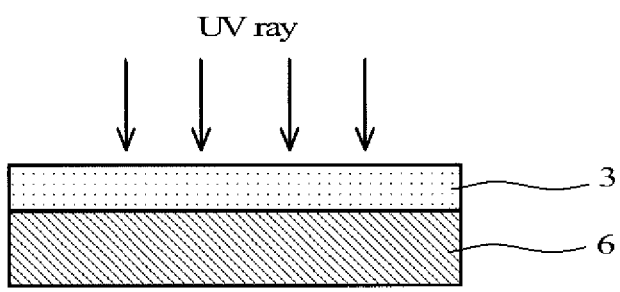
FIG. 2B is an illustrative drawing of a step (BB) of the method of manufacturing an image display apparatus according to the present invention.
Figure 2C:
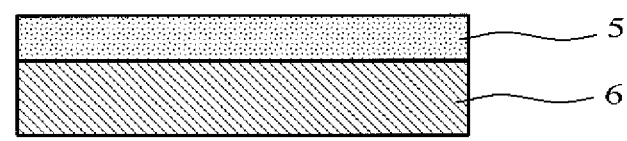
FIG. 2C is an illustrative drawing of a step (BB) of the method of manufacturing an image display apparatus according to the present invention.

Next, as shown in FIG. 2B, UV rays are irradiated to the photocurable resin composition 3 coated in the step (AA) for curing to form the light-transmissive cured resin layer 5 (FIG. 2C). By curing the composition in this manner, the light-transmissive cured resin layer 5 between the light shielding layer and the image display member can be sufficiently photocured without being eliminated from between the light shielding layer 1 and the image display member 6. The level of the curing is such that the gel fraction of the light-transmissive cured resin layer 5 is preferably 90% or more, and more preferably 95% or more.

<Step (CC) (Bonding Step)>

Figure 2D:
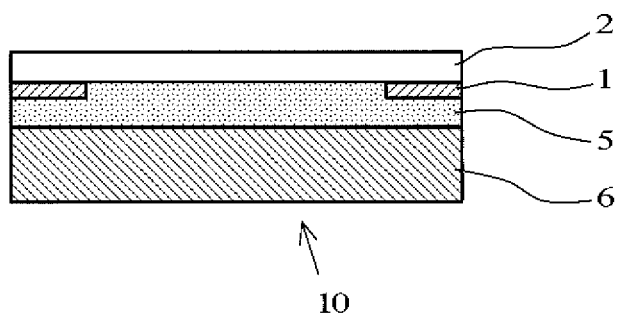
FIG. 2D is an illustrative drawing of a step (CC) of the method of manufacturing an image display apparatus according to the present invention.
Figure 3:
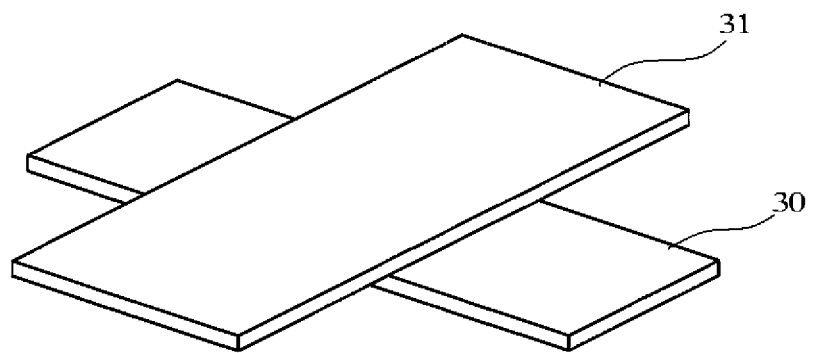
FIG. 3 is an illustrative drawing of the evaluation test on the adhesion state of the light-transmissive cured resin layer.

Next, as shown in FIG. 2D, the light-transmissive cover member 2 is bonded to the light-transmissive cured resin layer 5 of the image display member 6 on the side of the light shielding layer 1. The bonding can be performed under pressure at 10 to 80° C. using a publicly known pressure bonding apparatus. Accordingly, the image display member 6 and the light-transmissive cover member 2 are laminated to each other via the light-transmissive cured resin layer 5 to obtain the image display apparatus 10.

Examples of the image display member 6 may include a liquid crystal display panel, an organic EL display panel, a plasma display panel and a touch panel.

The light transmittance level of the light-transmissive cured resin layer 5 may be such that an image formed on the image display member 6 can be visually recognized.

EXAMPLES

The present invention will be specifically described by way of examples below.

Example 1

(Step (A) (Coating Step))

First, a glass plate having a size of 45 (w)×80 (l)×0.4 (t) mm was prepared. An entire region of the outer edge of the glass plate was coated with a photocurable black ink (MRX Ink, Teikoku Printing Inks Mfg. Co., Ltd) by a screen printing method so as to form a light shielding layer having a dry thickness of 40 µm and a width of 4 mm. The coated black ink was dried to prepare a glass plate with a light shielding layer.

Also, 6 parts by weight of polyisoprene methacrylate (UC102, Kuraray Co., Ltd.) as a radical photopolymerizable poly(meth)acrylate, 15 parts by weight of dicyclopentenyloxyethyl methacrylate and 5 parts by weight of lauryl methacrylate as a reactive diluent, 20 parts by weight of polybutadiene (Polyvest 110, Evonik Japan. Co., Ltd.) as a plasticizer, 1 part by weight of a photopolymerization initiator (Irgacure 184, BASF Japan Ltd.) and 53 parts by weight of a hydrogenated terpene resin (Clearon M105, Yasuhara Chemical Co., Ltd.) as a tackifies were uniformly mixed to prepare a photocurable resin composition. The viscosity (cone-plate rheometer, 25° C., cone and plate C35/2, rotational speed 10 rpm) of this photocurable resin composition was approximately 6 Pa·s.

Next, the photocurable resin composition was discharged on the entire light shielding layer-formed surface of the glass plate including the light shielding layer with a resin dispenser to form a photocurable resin composition film having an average thickness of 200 µm. The photocurable resin composition film was formed so as to be substantially spread over the entire region of the light shielding layer as shown in FIG. 1B in a thickness thicker by 160 µm than the light shielding layer having a thickness of 40 µm.

(Step (B) (Curing Step))

Next, the photocurable resin composition film was irradiated with PIT rays having an intensity of 50 mW/cm$^2$ for 60 seconds so that the accumulated light amount becomes 3000 mJ/cm$^2$, using a UV irradiation device (LC-8, Hamamatsu Photonics K.K.), to cure the photocurable resin composition film. In this manner, a light-transmissive cured resin layer was formed.

The photocurable resin composition film after UV irradiation, that is the light-transmissive cured resin layer, had a curing rate of approximately 92%. The curing rate was calculated by using as an index an absorption peak height from the baseline at 1640 to 1620 cm$^{-1}$ in the FT-IR measurement chart.

Furthermore, the tackiness of the surface of the light-transmissive cured resin layer was 110 N/cm$^2$, based on a measurement by a probe tack method using a tacking tester (TAC-II, Rhesca Co., Ltd.).

(Step (C) (Bonding Step))

Next, the glass plate obtained in the step (B) was placed on the surface of a laminated polarizing plate of a liquid crystal display element having a size of 40 (W)×70 (L) mm so that the light-transmissive cured resin layer side of the glass plate is on the polarizing plate side. Then, pressure was applied from the glass plate side with a rubber roller so that the glass plate was bonded to the liquid crystal display element. When the bonded liquid crystal display element was visually observed from the glass plate side, air bubbles were not observed around the light shielding layer.

<Evaluation>

The product obtained in each of the steps in Example 1 was visually observed on whether or not air bubbles exist in the boundary between the light shielding layer and the photocurable resin composition film layer or the light-transmissive cured resin layer, as will be described below. In addition, the adhesion state of the liquid crystal display apparatus was evaluated as will be described below.

(Existence of Air Bubbles)

The product obtained in each of the steps in Example 1 was visually observed on whether or not air bubbles exist in the boundary between the light shielding layer and the photocurable resin composition film layer or the cured resin layer. As a result, air bubbles were not observed in the product obtained in any of the steps and in the final liquid crystal display apparatus.

(Evaluation of Adhesion State)

When preparing a liquid crystal display apparatus, a glass base 30 having a size of 40 (W)×70 (L) mm was used instead of a liquid crystal display element. A glass plate 31 including a light-transmissive cured resin layer formed thereon was bonded to the glass base 30 on the light-transmissive cured resin layer side into a cross shape. Thus, a glass connection body was obtained. Then, whip the glass base 30 positioned on the lower side of the connection body was fixed, the glass plate 31 positioned on the upper side was peeled off directly upward. Then, the peeling property was visually observed, and the adhesion state was evaluated as "A" in accordance with the criteria below.

Rank: Criteria

A: When aggregation peeling occurred

B: When both aggregation peeling and interface peeling existed.

C: When interface peeling occurred

Example 2

A liquid crystal display apparatus and a glass connection body for measuring an adhesion strength were prepared in the same manner as in Example 1, except that in the step (A) (Coating step) of Example 1, the photocurable resin composition film was formed so as to be spread over approximately 70% of the width of the light shielding layer. Then, observation was performed on whether or not air bubbles exist, and the adhesion state was evaluated. As a result, even when the photocurable resin composition film was formed to be spread over approximately 70% of the width of the light shielding layer, air bubbles did not exist in the product obtained in each step and in the final liquid crystal display apparatus in Example 2, and the adhesion state was also evaluated as "A."

Example 3

A liquid crystal display apparatus and a glass connection body for measuring an adhesion strength were prepared in the same manner as in Example 1, except that in the step (A) (Coating step) of Example 1, the photocurable resin composition film formed had a thickness of approximately 1.2 times the thickness of the light shielding layer. Then, observation was performed on whether or not air bubbles exist, and the adhesion state was evaluated. As a result, when the photocurable resin composition film formed had a thickness of approximately 1.2 times the thickness of the light shielding layer, air bubbles did not exist in the product obtained in each step and in the final liquid crystal display apparatus in Example 3, and the adhesion state was also evaluated as "A."

Example 4

Figure 4A:
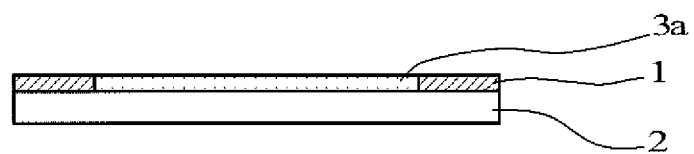
FIG. 4A is an illustrative drawing of an embodiment of coating of the light-transmissive cover member with the photocurable resin composition.
Figure 4B:
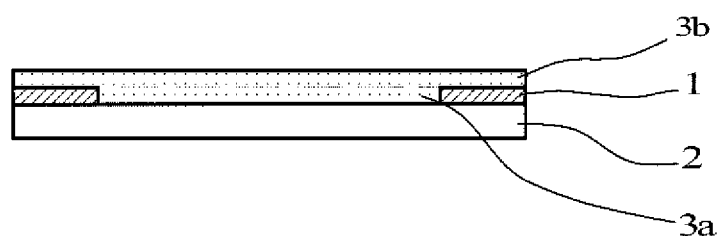
FIG. 4B is an illustrative drawing of an embodiment of coating of the light-transmissive cover member with the photocurable resin composition.

A liquid crystal display apparatus and a glass connection body for measuring an adhesion strength were prepared in the same manner as in Example 1, except that in the step (A) (Coating step) of Example 1, as shown in FIG. 4A, a photocurable resin composition 3*a* was coated in the same thickness as that of the light Shielding layer 1 without being spread over the light shielding layer 1, and further, as shown in FIG. 4B, a photocurable resin composition 3*b* was coated so as to be spread over the light shielding layer 1. Then, observation was performed on whether or not air bubbles exist, and the adhesion state was evaluated. As a result, even when the photocurable resin composition was multi-layered, air bubbles did not exist in the product obtained in each step and in the final liquid crystal display apparatus in Example 4, and the adhesion state was also evaluated as "A."

Comparative Example 1

Figure 5:
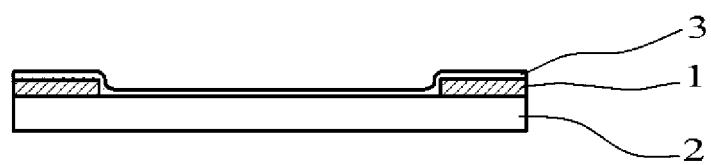
FIG. 5 is an illustrative drawing of an embodiment of coating of the light-transmissive cover member with the photocurable resin composition.

A liquid crystal display apparatus and a glass connection body for measuring an adhesion strength were prepared in the same manner as in Example 1, except that in the step (A) (Coating step) of Example 1, the photocurable resin composition 3 was spread over an entire region of the light shielding layer 1, but had a thickness of 30 μm thinner than that of the light shielding layer 1, as shown in FIG. 5. Then, observation was performed on whether or not air bubbles exist, and the adhesion state was evaluated. As a result, although air bubbles were not observed in the product obtained in the step (A), air bubbles were observed in the product obtained in the step (C). The adhesion state was also evaluated as "A."

Comparative Example 2

Figure 6:
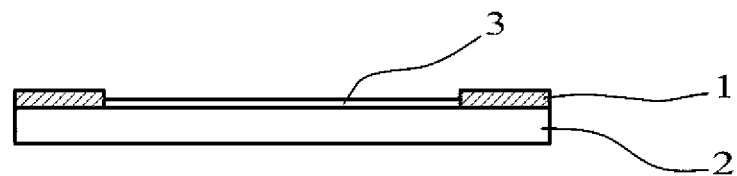
FIG. 6 is an illustrative drawing of an embodiment of coating of the light-transmissive cover member with the photocurable resin composition.

A liquid crystal display apparatus, and a glass connection body for measuring an adhesion strength were prepared in the same manner as in Example 1, except that in the step (A) (Coating step) of Example 1, as shown in FIG. 6, the photocurable resin composition 3 was not formed so as to be spread over the light shielding layer 1, and was coated thinner than the light shielding layer 1. Then, observation was performed on whether or not air bubbles exist, and the adhesion state was evaluated result, although air bubbles were not found in the product obtained in the step (A), air bubbles were found in the product obtained in the bonding step of the step (C). The adhesion state was also evaluated as "A."

Comparative Example 3

A liquid crystal display apparatus and a glass connection body for measuring an adhesion strength were prepared in the same manner as in Example 1, except that in the step (A) of Example 1, the photocurable resin composition was not coated on the glass plate, but formed on a release film; UV irradiation similar to the step (B) of Example 1 was performed to form a light-transmissive cured resin layer of the photocurable resin composition on the release film; and the light-transmissive cured resin layer was transferred on the glass plate including the light shielding layer formed thereon. Then, observation was performed on whether or not air bubbles exist, and the adhesion state was evaluated. As a result, air bubbles were found around the step of the light shielding layer when the light-transmissive cured resin layer was transferred. Air bubbles were also observed in the product obtained in the following step (C). The adhesion state was evaluated as "B."

INDUSTRIAL APPLICABILITY

According to the method of manufacturing an image display apparatus of the present invention, the light-transmissive cured resin layer between the light shielding layer and the image display member can be sufficiently photocured without being excessively eliminated from between the light shielding layer and the image display member.

Furthermore, the step formed between the light shielding layer and the light shielding layer formation-side surface of the light-transmissive cover member can be canceled. Therefore, the manufacturing method according to the present invention is useful in industrial manufacturing of information terminals such as a smartphone equipped with a touch panel, and a touch pad.

REFERENCE SIGNS LIST

1 Light shielding layer
2 Light-transmissive cover member
2a (Light shielding layer formation-side) surface of light-transmissive cover member
3, 3a, 3b Photocurable resin composition
4 Step
5 Light-transmissive cured resin layer
6 Image display member
10 Image display apparatus
30 Glass base
31 Glass plate

The invention claimed is:

1. A method of manufacturing an image display apparatus wherein an image display member and a light-transmissive cover member having a light shielding layer formed around an outer edge of the cover member are laminated to each other via a light-transmissive cured resin layer formed from a liquid photocurable resin composition such that a surface of the light-transmissive cover member on which the light shielding layer is formed is arranged on a side of the image display member, the manufacturing method comprising the following steps (A) to (C):
　<Step (A)>
　　coating the surface of the light-transmissive cover member on which the light shielding layer is formed with the liquid photocurable resin composition in a thickness thicker than that of the light shielding layer so that a step formed by the light shielding layer and the surface of the light-transmissive cover member on which the light shielding layer is formed is canceled;
　<Step (B)>
　　irradiating UV rays to the coated photocurable resin composition for curing to form a light-transmissive cured resin layer having a cure rate of 90% or more and less than 100%; and
　<Step (C)>
　　bonding the light-transmissive cover member with the image display member such that the light shielding layer and the light-transmissive cured resin layer are between the light-transmissive cover member and the image display member; wherein
　　in the step (A), a mixed amount of a tackifier in 100 parts by mass of the liquid photocurable resin composition is 40 to 70 parts by mass,
　　in the step (B), an initial adhesive strength of the coated photocurable resin composition, which is cured to form the light-transmissive cured resin layer having a cure rate of 90% or more and less than 100%, is increased by the tackifier, and
　　in the step (C), the bonding is performed under pressure at 10 to 80° C. using a pressure bonding apparatus.

2. The manufacturing method according to claim 1, wherein the image display member is a liquid crystal display panel, an organic EL display panel or a touch panel.

3. The manufacturing method according to claim 1, wherein in the step (A), the photocurable resin composition is coated in a thickness 1.2 to 50 times a thickness of the light shielding layer.

4. The manufacturing method according to claim 1, wherein in the step (B), the curing rate of the light-transmissive cured resin layer is 95% or more and less than 100%.

5. The manufacturing method according to claim 1, wherein the liquid photocurable resin composition contains polyurethane-based (meth)acrylate or polyisoprene-based (meth)acrylate, and a photopolymerization initiator.

6. The manufacturing method according to claim 1, wherein the tackifier is selected from the group consisting of petroleum resins, polybutadiene, and polyisoprene.

7. The manufacturing method according to claim 1, wherein the tackifier is selected from the group consisting of polybutadiene and polyisoprene.

8. The manufacturing method according to claim 1, wherein the mixed amount of the tackifier in 100 parts by mass of the liquid photocurable resin composition is 50 to 70 parts by mass.

9. A method of manufacturing an image display apparatus wherein an image display member and a light-transmissive cover member having a light shielding layer formed around an outer edge of the cover member are laminated to each other via a light-transmissive cured resin layer formed from a liquid photocurable resin composition such that a surface of the light-transmissive cover member on which the light shielding layer is formed is arranged on a side of the image display member, the manufacturing method comprising the following steps (A) to (C):
　<Step (A)>
　　coating the surface of the light-transmissive cover member on which the light shielding layer is formed with the liquid photocurable resin composition over the light shielding layer in a thickness thicker than that of the light shielding layer so that a step formed by the light shielding layer and the surface of the light-transmissive cover member on which the light shielding layer is formed is canceled;
　<Step (B)>
　　irradiating UV rays to the coated photocurable resin composition for curing to form a light-transmissive cured resin layer having a cure rate of 90% or more and less than 100%; and
　<Step (C)>
　　bonding the light-transmissive cover member with the image display member such that the light shielding layer and the light-transmissive cured resin layer are between the light-transmissive cover member and the image display member; wherein
　　in the step (A), a mixed amount of a tackifier in 100 parts by mass of the liquid photocurable resin composition is 40 to 70 parts by mass,
　　in the step (B), an initial adhesive strength of the coated photocurable resin composition, which is cured to form the light-transmissive cured resin layer having a cure rate of 90% or more and less than 100%, is increased by the tackifier, and
　　in the step (C), the bonding is performed under pressure at 10 to 80° C. using a pressure bonding apparatus.

10. A method of manufacturing an image display apparatus wherein an image display member and a light-transmissive cover member having a light shielding layer formed around an outer edge of the cover member are laminated to each other via a light-transmissive cured resin layer formed from a liquid photocurable resin composition such that a surface of the light-transmissive cover member on which the light shielding layer is formed is arranged on a side of the image display member, the manufacturing method comprising the following steps (A) to (C):

<Step (A)>
coating the surface of the light-transmissive cover member on which the light shielding layer is formed with the liquid photocurable resin composition in a thickness thicker than that of the light shielding layer so that a step formed by the light shielding layer and the surface of the light-transmissive cover member on which the light shielding layer is formed is canceled;

<Step (B)>
irradiating UV rays to the coated photocurable resin composition for curing to form a light-transmissive cured resin layer having a cure rate of 90% or more and less than 100%; and <Step (C)>
bonding the light-transmissive cover member with the image display member such that the light shielding layer and the light-transmissive cured resin layer are between the light-transmissive cover member and the image display member; wherein in the step (A), a mixed amount of a tackifier in 100 parts by mass of the liquid photocurable resin composition is 40 to 70 parts by mass, in the step (B), an initial adhesive strength of the coated photocurable resin composition, which is cured to form the light-transmissive cured resin layer having a cure rate of 90% or more and less than 100%, having temporarily cured is increased by the tackifier, in the step (C), the bonding is performed under pressure at 10 to 80° C. using a pressure bonding apparatus, and the tackifier is selected from the group consisting of terpene-based resins, a terpene resin, a terpene phenol resin, a hydrogenated terpene resin, rosin resins, a natural rosin, a polymerized rosin, a rosin ester, a hydrogenated rosin, petroleum resins, polybutadiene, and polyisoprene.

* * * * *